(12) United States Patent
Gaudin

(10) Patent No.: US 9,123,631 B2
(45) Date of Patent: *Sep. 1, 2015

(54) METHOD FOR MOLECULAR ADHESION BONDING WITH COMPENSATION FOR RADIAL MISALIGNMENT

(71) Applicant: SOITEC, Bernin (FR)

(72) Inventor: Gweltaz Gaudin, Grenoble (FR)

(73) Assignee: SOITEC, Bernin (FR)

( * ) Notice: Subject to any disclaimer, the term of this patent is extended or adjusted under 35 U.S.C. 154(b) by 215 days.

This patent is subject to a terminal disclaimer.

(21) Appl. No.: 13/838,031

(22) Filed: Mar. 15, 2013

(65) Prior Publication Data

US 2013/0210171 A1 Aug. 15, 2013

Related U.S. Application Data

(63) Continuation of application No. 12/897,491, filed on Oct. 4, 2010, now Pat. No. 8,475,612.

(30) Foreign Application Priority Data

Jul. 7, 2010 (FR) ...................................... 10 55508

(51) Int. Cl.
*B29C 65/00* (2006.01)
*H01L 21/18* (2006.01)
(Continued)

(52) U.S. Cl.
CPC ............ *H01L 21/185* (2013.01); *H01L 21/187* (2013.01); *H01L 24/75* (2013.01); *H01L 24/80* (2013.01); *H01L 24/94* (2013.01); *H01L 25/0657* (2013.01); *H01L 25/50* (2013.01); *H01L 2224/08146* (2013.01); *H01L 2224/75702* (2013.01); *H01L 2224/75756* (2013.01); *H01L 2224/80006* (2013.01); *H01L 2224/80357* (2013.01); *H01L 2224/80895* (2013.01);
(Continued)

(58) Field of Classification Search
CPC .......... B29C 66/90; B29C 66/92; B29C 66/95
USPC .................. 156/297, 299, 64; 438/14, 16, 457
See application file for complete search history.

(56) References Cited

U.S. PATENT DOCUMENTS

| | | |
|---|---|---|
| 4,752,180 A | 6/1988 | Yoshikawa |
| 5,131,968 A | 7/1992 | Wells et al. |

(Continued)

FOREIGN PATENT DOCUMENTS

| | | |
|---|---|---|
| WO | WO 2006/038030 A2 | 4/2006 |
| WO | WO 2007/047536 A2 | 4/2007 |

OTHER PUBLICATIONS

Hyun-Joon, Kim-Lee et al., "Capillary Assisted Alignment for High Density Wafer-Level Integration", Computational Mechanics Center, University of Wisconsin (2007).

(Continued)

*Primary Examiner* — George Koch
(74) *Attorney, Agent, or Firm* — TraskBritt

(57) ABSTRACT

A method for bonding a first wafer on a second wafer by molecular adhesion where the wafers have an initial radial misalignment between them. The method includes bringing the two wafers into contact so as to initiate the propagation of a bonding wave between the two wafers while a predefined bonding curvature is imposed on at least one of the two wafers during the contacting step as a function of the initial radial misalignment.

18 Claims, 8 Drawing Sheets

(51) Int. Cl.
  *H01L 23/00* (2006.01)
  *H01L 25/065* (2006.01)
  *H01L 25/00* (2006.01)

(52) U.S. Cl.
  CPC ........... *H01L2224/80896* (2013.01); *H01L 2224/80948* (2013.01); *H01L 2224/94* (2013.01); *H01L 2924/3511* (2013.01); *Y10T 156/10* (2015.01); *Y10T 156/1089* (2015.01); *Y10T 156/1092* (2015.01)

(56) References Cited

U.S. PATENT DOCUMENTS

| | | | |
|---|---|---|---|
| 7,682,933 | B1 | 3/2010 | Loomis |
| 8,475,612 | B2* | 7/2013 | Gaudin .................. 156/64 |
| 2006/0141742 | A1 | 6/2006 | Fournel et al. |
| 2007/0087531 | A1 | 4/2007 | Kirk et al. |
| 2007/0117258 | A1 | 5/2007 | Moriceau et al. |
| 2007/0212856 | A1 | 9/2007 | Owen |
| 2009/0280595 | A1 | 11/2009 | Broekaart et al. |
| 2010/0122762 | A1 | 5/2010 | George |

OTHER PUBLICATIONS

Turner, Kevin T. et al., "Predicting Distortions and Overlay Errors Due to Wafer Deformation During Chucking on Lithography Scanners", Journal of Micro/Nanolith., vol. 8, No. 4, pp. 043015-1-043015-8 (2009).

Turner, Kevin T. et al., "Mechanics of Wafer Bonding: Effect of Clamping", Journal of Applied Physics, vol. 95, No. 1, pp. 349-355 (2004).

Turner, Kevin T. et al., "Modeling of Direct Wafer Bonding: Effect of Wafer Bow and Etch Patterns", Journal of Applied Physics, vol. 92, No. 12, pp. 7658-7666 (2002).

French Search Report FR 1055508 dated Jan. 17, 2011.

Examination and Search Report, Application No. 201102998-0, mailed Feb. 21, 2012.

* cited by examiner

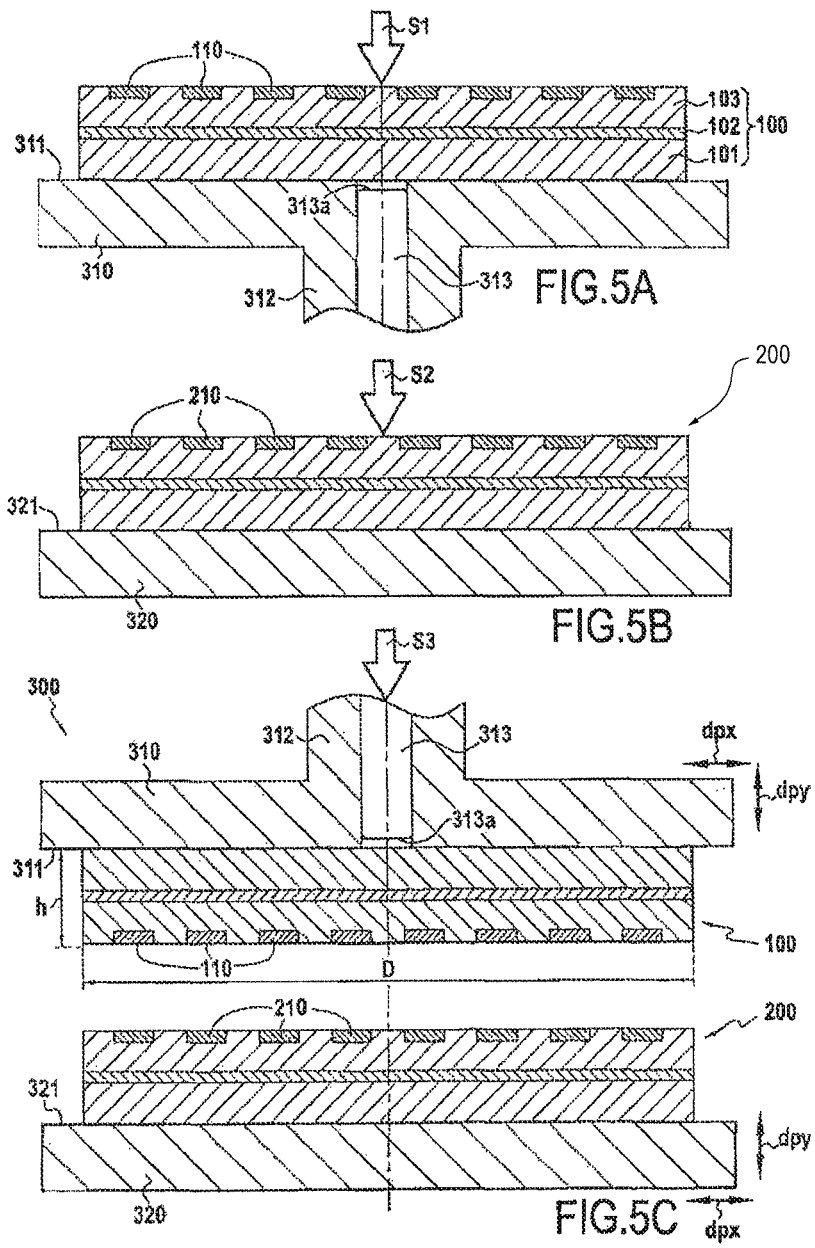

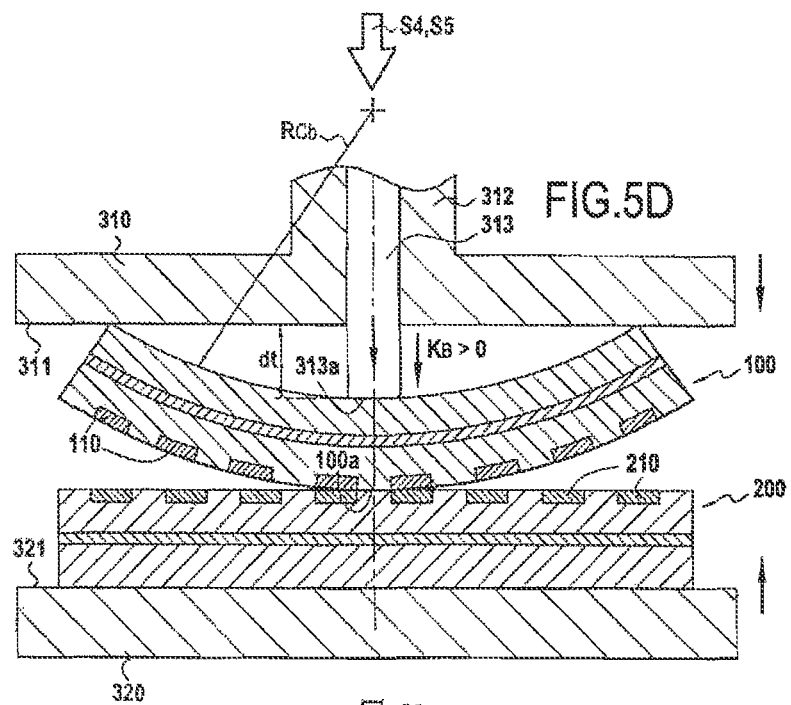
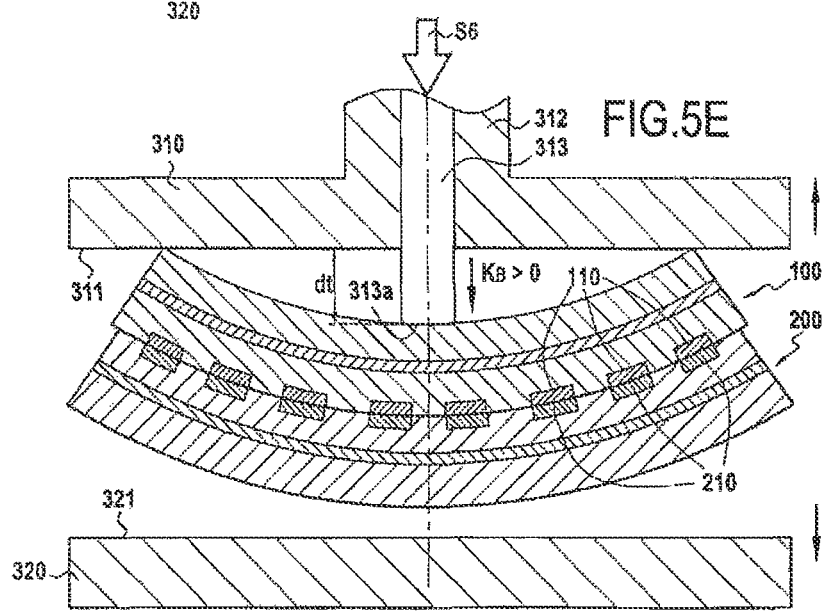

METHOD FOR MOLECULAR ADHESION BONDING WITH COMPENSATION FOR RADIAL MISALIGNMENT

CROSS-REFERENCE TO RELATED APPLICATIONS

This application is a continuation of U.S. patent application Ser. No. 12/897,491, filed Oct. 4, 2010, now U.S. Pat. No. 8,475,612, issued Jul. 2, 2013, which is a national phase entry under 35 U.S.C. §371 of French Patent Application 1055508, filed Jul. 7, 2010, designating the United States of America.

FIELD OF THE INVENTION

The present invention concerns the field of multilayer semiconductor wafers or structures produced according to the technology of three-dimensional integration (3D integration), which involves the transfer onto a first wafer, referred to as the final substrate, of at least one layer formed from a second wafer, this layer corresponding to the portion of the second wafer in which elements have been formed, for example, a plurality of microcomponents, other corresponding elements also being formed in the first wafer.

BACKGROUND OF THE INVENTION

Particularly owing to the very small size and the large number of microcomponents present on a given layer, each transferred layer, that is to say, each wafer comprising the layer, must be positioned on the final substrate (the first wafer on its own or already comprising other transferred layers) with great precision in order to comply with very strict alignment with the underlying layer. It may furthermore be necessary to carry out treatments on the layer after its transfer, for example, in order to form other microcomponents, in order to uncover microcomponents on the surface, in order to produce interconnects, etc.; these treatment operations must be carried out with very great precision in relation to the components present in the layer.

The transfer of a layer onto the final substrate involves molecular adhesion bonding between a first wafer and a second wafer of the type described above, the second wafer generally being subsequently thinned. During the bonding, the wafers are mechanically aligned. Three types of alignment defects may be observed between the two wafers, namely, alignment defects of the "offset" or "shift" type, of the rotation type and of the radial type (also known by the name "run-out," magnification error or deformation error).

When a sequence of lithography steps is carried out on a single wafer, these types of defects are generally corrected by using a compensation algorithm in a lithography machine in order to preserve perfect alignment between each step.

During alignment between two wafers with a view to bonding, the alignment defects of the shift and rotation types can be compensated for mechanically by modifying the relative position of the wafers with respect to one another in the bonding machine. However, the alignment defects of the radial type cannot be compensated for by such repositioning of the wafers.

The radial misalignment occurs when two wafers to be aligned have different radial expansions. The radial expansions may be due to the fact that each wafer has undergone a different process of fabricating microcomponents and/or the fact that the processes applied to one or other of the wafers can lead to them being strained and make their dimensions vary on the microscopic scale, as in the case, for example, of layer deposition or oxidation, which induces tensile strains for the wafer.

FIG. 1A illustrates the alignment between a first wafer 10 and a second wafer 20 with a view to bonding them by molecular adhesion. A first series of microcomponents 11 has been formed beforehand on the bonding face of the first wafer 10, while a second series of microcomponents 21 has been formed beforehand on the upper face of the second wafer 20, intended to be bonded to the first wafer. The microcomponents 11 are intended to be aligned with the microcomponents 21 after bonding of the wafers.

In the example described here, however, the first and second wafers have different radial expansions, thus creating a radial misalignment between these wafers, which, after bonding, results in offsets between the majority of the microcomponents such as the offsets $\Delta_{11}$, $\Delta_{22}$, $\Delta_{33}$, $\Delta_{55}$, $\Delta_{66}$ or $\Delta_{77}$ indicated in FIG. 1B (respectively corresponding to the offsets observed between the pairs of microcomponents $11_1/21_1$, $11_2/21_2$, $11_3/21_3$, $11_5/21_5$, $11_6/21_6$ and $11_7/21_7$).

The radial expansions responsible for the radial misalignment between two wafers are generally homogeneous over the wafers, thus creating a radial misalignment that evolves (i.e., increases) quasi-linearly between the center and the periphery of the wafer.

The radial misalignment may be corrected in particular during the conventional steps of forming components by photolithography, by means of a correction algorithm and as a function of misalignment measurements carried out on a wafer.

The correction of the radial misalignment, however, can be carried out only on one wafer on its own. Moreover, when the production of the microcomponents involves a step of bonding between two wafers as is the case when producing three-dimensional structures, it is no longer possible to carry out corrections relating to the radial misalignment.

Furthermore, when a layer of microcomponents is transferred onto a final substrate having a first layer of microcomponents, it is very important to be able to minimize the radial misalignment between these microcomponents of each of the layers when they are intended to be interconnected together. It is not in fact possible to compensate by lithography for the misalignments existing between the microcomponents of the two layers in this case. Thus, the present invention now provides a solution to these problems.

SUMMARY OF THE INVENTION

This invention now makes it possible to compensate for the initial radial alignment existing between first and second wafers intended to be bonded together. To this end, the present invention provides a method for bonding the first wafer on the second wafer by molecular adhesion by bringing the two wafers in contact so as to initiate the propagation of a bonding wave between the two wafers, so that a predefined bonding curvature is imposed on at least one of the two wafers during the contacting step as a function of the initial radial misalignment. As explained below in detail, by monitoring the curvature of the wafers during their bonding, it is possible to induce an additional radial misalignment, which will compensate for the radial misalignment initially existing.

Advantageously, the method comprises, before the bonding of the wafers, measuring the initial radial misalignment between the two wafers to be compensated, measuring the curvature of each wafer before bonding, determining a compensating radial misalignment for the initial radial misalignment between the two wafers, calculating a post-bonding curvature capable of generating the compensating radial misalignment between the two wafers, and calculating the predefined bonding curvature as a function of the calculated post-bonding curvature and of the curvatures of the wafers.

According to a particular aspect of the invention, the method comprises holding the first wafer and the second wafer facing one another, respectively using a first holding support and a second holding support, the first support imposing the predefined bonding curvature on the first wafer, bringing the wafers in contact in order to initiate the propagation of a bonding wave between the wafers, and releasing the second wafer from the second holding support before or while being brought in contact with the first wafer, so that the second wafer adapts to the bonding curvature imposed on the first wafer during the propagation of the bonding wave.

According to one aspect of the invention, the second wafer is free to adapt to the predefined bonding curvature imposed on the first wafer during the propagation of the bonding wave. The predefined bonding curvature can be imposed on the first wafer by actuating a jack mounted on the first holding support. Alternatively, the predefined bonding curvature can be imposed on the first wafer by a membrane interposed between the first wafer and the first holding support, with the membrane having a curvature corresponding to the predefined bonding curvature. Further, the predefined bonding curvature can be imposed on the first wafer by the first holding support, with the first holding support having a curvature corresponding to the predefined bonding curvature.

According to a particular aspect of the invention, the wafers each comprise microcomponents on their respective bonding faces, at least some of the microcomponents of one of the wafers being intended to be aligned with at least some of the microcomponents of the other wafer. Also, the wafers are preferably circular wafers of silicon having a diameter of 300 mm.

The present invention also relates to an apparatus for bonding a first wafer on a second wafer by molecular adhesion, the wafers having an initial radial misalignment between them. The apparatus comprises a first and second holding support for respectively holding the first wafer and the second wafer, in which apparatus the first holding support comprises means for imposing a predefined bonding curvature on the first wafer as a function of the initial radial misalignment. The apparatus controls the second holding support in order to release the second wafer from the second support before or while being brought in contact with the first wafer, so that the second wafer adapts to the bonding curvature imposed on the first wafer during the propagation of a bonding wave.

The bonding apparatus generally comprises processing means for calculating the predefined bonding curvature as a function of the initial radial misalignment, or a radius of curvature corresponding to the predefined bonding curvature as a function of the initial radial misalignment.

According to one characteristic of the invention, the first holding support furthermore comprises a jack capable of imposing the predefined bonding curvature on the first wafer, the jack being driven according to a radius of curvature corresponding to the predefined bonding curvature. The apparatus controls the second holding support in order to release the second wafer from the second support after being brought in contact with the first wafer, so that the second wafer adapts to the bonding curvature imposed on the first wafer during the propagation of a bonding wave.

According to another characteristic of the invention, the apparatus furthermore comprises a membrane interposed between the first wafer and the first holding support, the membrane having a curvature corresponding to the predefined bonding curvature.

According to yet another characteristic of the invention, the first holding support has a curvature corresponding to the predefined bonding curvature.

According to one aspect of the invention, the first and second holding supports comprise means for holding the wafers by suction or by electrostatic force.

According to another aspect of the invention, the first and second holding supports are adapted to receive circular substrates with a diameter of 100 mm, 150 mm, 200 mm or 300 mm.

Further aspects and details and alternate combinations of the elements of this invention will be apparent from the following detailed description and are also within the scope of the inventor's invention.

BRIEF DESCRIPTION OF THE FIGURES

The present invention may be understood more fully by reference to the following detailed description of the preferred embodiment of the present invention, illustrative examples of specific embodiments of the invention, and the appended figures in which:

FIGS. 5A to 5G are schematic views showing the production of a three-dimensional structure by using the molecular adhesion bonding method of the present invention;

DETAILED DESCRIPTION

The present invention applies in general to the bonding by molecular adhesion between two wafers that have different radial expansions, leading to a radial misalignment between them after bonding.

The invention applies more particularly, but not exclusively, to the bonding by molecular adhesion between at least two wafers, each comprising components in which at least some of the components of each of the wafers are intended to be aligned after bonding.

In order to compensate for the phenomenon of radial misalignment of the wafers after bonding, the present invention proposes to impose a bonding curvature, which has been defined beforehand as a function of the initial radial misalignment, on the wafers during their bonding.

Figure 1A:
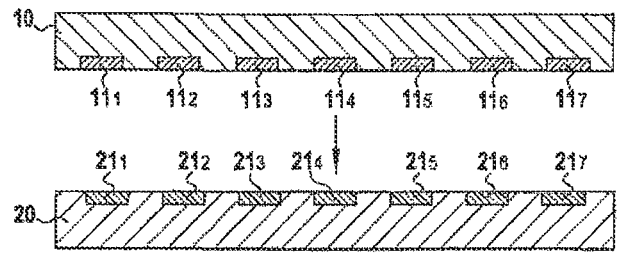
FIGS. 1A and 1B are schematic views showing the production of a three-dimensional structure according to the prior art.
Figure 1B:
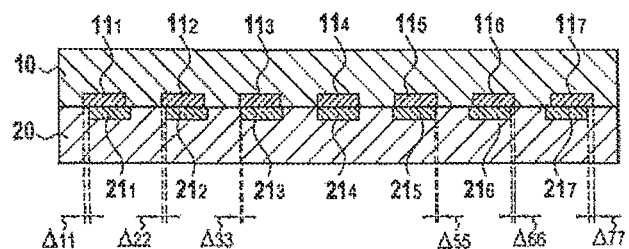
Figure 2:
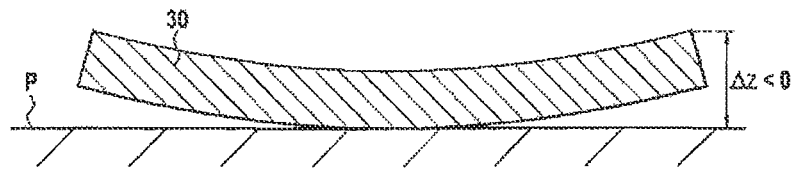
FIGS. 2 and 3 show wafers having deformations of the "bow" type.
Figure 3:
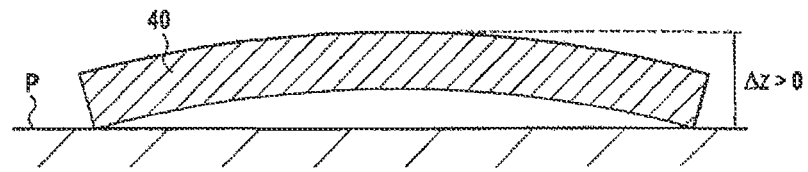

More precisely, before bonding, each of the two wafers has its own curvature, which may be concave, as in the case of the wafer 30 in FIG. 2, or convex, as in the case of the wafer 40 in FIG. 3. This curvature determines the curvature deformation of the wafers, which is referred to by the term "bow" in semiconductor technology. As illustrated in FIGS. 2 and 3, the bow $\Delta z$ of a wafer corresponds to the distance (arrow), generally measured level with the center of the wafer, between a reference plane P (typically perfectly flat), on which the wafer rests freely, and the wafer itself. On the scale of the wafer diameters conventionally used in the field of semiconductors, namely, between a few tens of millimeters and 300 millimeters, the bow is measured in micrometers whereas the curvature is generally measured in $m^{-1}$ or $km^{-1}$, because the curvature of the wafers used in the field of semiconductors is very small and, consequently, the corresponding radius of curvature is very large.

Figure 4A:
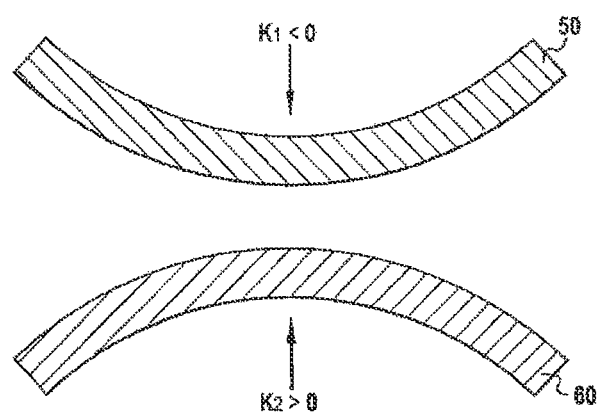
FIGS. 4A to 4C show the various curvatures obtained before, during and after the bonding of two wafers by molecular adhesion.
Figure 4B:
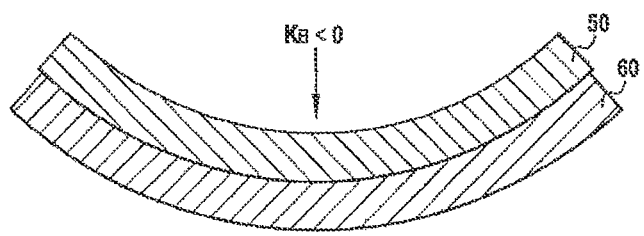
Figure 4C:
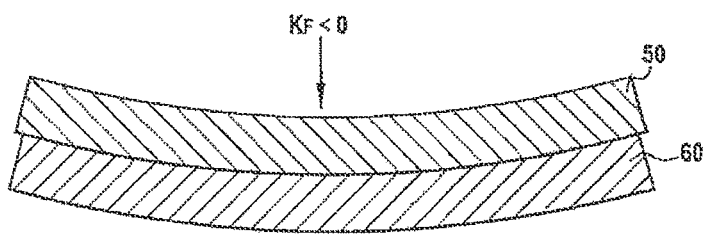

FIGS. 4A to 4C show the variation of the curvatures before and after bonding of a first wafer 50 (top) on a support wafer 60 (base), respectively having an initial curvature $K_1$ and $K_2$ (FIG. 4A). During the molecular adhesion bonding, a curvature $K_B$, referred to as the "bonding curvature," is imposed on one of the two wafers 50 and 60 (FIG. 4B), the other wafer being adapted to the curvature imposed on this first wafer during the propagation of the bonding wave, as described in detail below. The curvature $K_B$ may be imposed by specific holding supports of a bonding machine, as described in detail below, the curvature $K_B$ being for only one of the two wafers while the other wafer is free to deform at the moment when the propagation of the bonding wave is initiated, in order to adapt during this propagation to the curvature imposed on the other wafer.

Once the bonding has been carried out and the wafers have been released from their respective holding supports, the structure constituted by the combination of the bonded wafers 50 and 60 has a curvature $K_F$, referred to as the "post-bonding curvature."

The post-bonding curvature $K_F$ may be calculated with the following Formula (1):

$$K_F = (2(K_1+K_2)+12K_B)/16 \tag{1}$$

This Formula (1) was determined on the basis of Formula (12) given in the document T. Turner et al., entitled "Mechanics of wafer bonding: Effect of clamping," *Journal of Applied Physics*, Vol. 95, No. 1, Jan. 1, 2004.

On the basis of this Formula (1), it can be seen that the influence of the bonding curvature $K_B$ on the post-bonding curvature $K_F$ predominates (by a factor of 6) over that of the initial curvatures $K_1$ and $K_2$, respectively, of the wafers 50 and 60.

Furthermore, the radial misalignment $D_R$ resulting between the two wafers after bonding may be determined by the following Formula (2):

$$D_R = -2(\epsilon R) \tag{2}$$

where R is the distance from the center of the wafer at the measurement point of the radial misalignment and $\epsilon$ is the strain exerted on the surface of the first wafer 50 (top).

There is, furthermore, a relationship between the strain exerted on the surface of the first wafer and the post-bonding curvature $K_F$, which is given by the following Formula (3):

$$\epsilon = K_F(h/2) \tag{3}$$

where h is the thickness of the first wafer.

By introducing the elements of Formula (3) corresponding to the strains into Formula (2), the relationship between the radial misalignment $D_R$ resulting after bonding and the post-bonding curvature $K_F$ is established by the following Formula (4):

$$D_R = -K_F h R \tag{4}$$

It can be seen that the radial misalignment $D_R$ is a function of the post-bonding curvature $K_F$.

Consequently, by knowing the initial radial misalignment $D_{Ri}$, a compensation radial misalignment $D_{Rc}$ is determined such that: $D_{Rc} = -D_{Ri}$, which, with Formula (4), gives: $D_{Rc} = K_F h R$.

The initial radial alignment may be measured by carrying out bonding between two wafers of the same batch of wafers and measuring the misalignment of the two wafers in order to deduce the initial radial component therefrom. The two wafers have alignment marks, such as simple crosses (measurement methods by means of Vernier or Moiré structures, which make it possible to measure the misalignment in microns by infrared microscopy or confocal infrared microscopy, and to do so at a plurality of positions on the water, which generally lie at its center and periphery. The various misalignment components and, in particular, the radial misalignment, can be extracted from these measurements. These measurements are generally carried out level with alignment marks arranged at the center and periphery of the wafer, for example, at 147 mm from the center of a 300 mm wafer. At the periphery, the radial misalignment is maximal and may exceed one micron, as presented in FIG. 7, which is measurable with the microscopic measurement techniques described above.

In this way, the initial radial alignment is known for an entire batch of wafers, to which it is possible to apply the bonding method of the invention and compensate for the initial radial misalignment. The pair of wafers used for measuring the initial radial misalignment may be withdrawn from the batch or separated in order to re-bond the wafers with the bonding curvature predetermined according to the invention.

This initial radial misalignment could also be determined by precisely measuring the distance between two microcomponents (to within 0.33 ppm) on each of the two wafers taken separately, and by comparing these two differences.

On the basis of this last Formula (4), the target post-bonding curvature $K_{Fc}$ allowing the compensation radial misalignment to be obtained, is calculated according to Formula (5):

$$K_{Fc} = D_{Rc}/(h \cdot R) \tag{5}$$

Formula (1) shows that the post-bonding curvature $K_F$ is determined as a function of the initial curvatures $K_1$ and $K_2$ of the two wafers and the bonding curvature $K_B$. Since the curvatures $K_1$ and $K_2$ correspond to the intrinsic curvatures of the two wafers, only the curvature $K_B$ represents the variable parameter, making it possible to adjust the value of the post-bonding curvature $K_F$.

Thus, the target value of the post-bonding curvature $K_{Fc}$ making it possible to obtain the compensation radial misalignment having been calculated on the basis of Formula (5) and the curvatures $K_1$ and $K_2$ having been measured beforehand, for example, by means of optical measurement tools such as KLA-Tencor Flexus from KLA-Tencor Corp (or by any measurement by a capacitive gauge, optical profilometry or mechanical profilometry, which makes it possible to determine the bow), the bonding curvature $K_B$ to be imposed to the wafers in order to obtain the target post-bonding curvature $K_{Fc}$ is calculated such that:

$$K_B = (8K_F - (K_1+K_2))/6 \tag{6}$$

An exemplary production of a three-dimensional structure by transferring a layer of microcomponents that is formed on a first wafer 100 onto a second wafer 200, using a method of bonding with compensation for the radial misalignment according to an embodiment of the invention, will now be described with reference to FIGS. 5A to 5G and 6. The wafers may, in particular, have diameters of 150 mm, 200 mm and 300 mm.

The production of the three-dimensional structure starts with the formation of a first series of microcomponents 110 on the surface of the first wafer 100 (FIG. 5A, Step S1) and a second series of microcomponents 210 on the surface of the second wafer 200 (FIG. 5B, Step S2). The microcomponents 110 and 210 may be entire components and/or only a part thereof. In the example described here, the first wafer 100 is a wafer with a diameter of 300 mm of the SOI type (silicon-on-insulator) comprising a layer of silicon 103 on a support 101 also made of silicon, a buried oxide layer 102, for example, of $SiO_2$, being arranged between the layer and the silicon support. The wafer 100 may also consist of another type of multilayer structure or a monolayer structure.

The second wafer 200 is preferably a silicon wafer with a diameter of 300 mm.

The microcomponents 110 and 210 are formed by photolithography by means of a mask, making it possible to define the regions for formation of patterns corresponding to the microcomponents to be produced.

The microcomponents 110 and 210 are intended to interact with one another, for example, in order to form finished components by joining microcomponents 110 and 210 in pairs, each constituting apart of the component to be produced, or in order to form interconnect circuits for corresponding microcomponents 110 and 210. It is, therefore, important to be able to ensure good alignment between the microcomponents 110 and 210 after bonding of the wafers.

According to the invention, a bonding machine is used that, during the bonding, imposes a bonding curvature $K_B$ on one of the wafers while allowing the other wafer to adapt to the imposed curvature by propagation of the bonding wave between the two wafers. This operation makes it possible to obtain a target post-bonding curvature $K_{Fc}$, which introduces between the two wafers the compensation radial misalignment $D_{Rc}$, which will compensate for the initial radial misalignment $D_{Ri}$ existing between the two wafers and induced (differential radial expansions between the wafers) during the various treatment steps carried out beforehand on each of the wafers before their bonding (lithography, layer deposition, heat treatments, etc.).

As illustrated in FIG. 5C, the bonding operation is carried out with a bonding machine or apparatus 300, which comprises first support plate 310 having a holding surface 311 intended to hold the first wafer 100 facing a second wafer 200, which is held on the holding surface 321 of a second support plate 320 of the machine 300. The support plates 310 and 320 are both equipped with holding means (not represented in FIG. 5C) such as electrostatic or suction holding means. The first and second support plates 310 and 320 are each mobile along displacement directions $d_{px}$ and $d_{py}$, which make it possible, on the one hand, to position the wafers facing one another while compensating for the misalignment errors in rotation and translation and, on the other hand, to bring the holding surfaces 311 and 321, respectively, of the first and second support plates 310 and 320 towards or away from one another. To this end, each support plate is, for example, mounted on an actuator (not represented in FIG. 5C), which is controlled by the bonding machine in order to adjust the distance between the two supports along the direction dp.

At the start of the bonding, the two wafers 100 and 200 are each held pressed on the holding surfaces of their respective support plate (FIG. 5C, Step S3).

Next, according to the invention, a curvature corresponding to the bonding curvature $K_B$, which was calculated by means of Formula (6) given above, and which makes it possible to obtain the target post-bonding curvature $K_{Fc}$ determined beforehand, is imposed on the first wafer 100 (or, alternatively, the second wafer) in order to induce a compensation radial misalignment $D_{Rc}$ as described above (FIG. 5D, Step S4).

To this end, the first support plate 310 comprises a jack or linear actuator 312 provided with a rod 313 that, when the jack is actuated, extends beyond the holding surface 311 of the plate 310 on which the first wafer 100 is pressed. As illustrated in FIG. 5D, in this case, the free end 313a of the rod 313 pushes on the first wafer, making it possible for a determined bonding curvature to be imparted to it. During the actuation of the jack 312, the force of attraction of the holding means of the support plate 310, namely, the suction force or the electrostatic force, can be controlled by the bonding machine so as to be reduced or even negated at the level of the central concentric region delimited on the holding surface 311 of the plate 310 so as to reduce the strains on the wafer during its curvature by the rod 313.

The bonding machine 300 controls the distance $d_t$ over which the rod 313 projects beyond the holding surface 311, this distance $d_t$ being determined as a function of the bonding curvature $K_B$ to be imposed on the wafers. More precisely, the jack 312 is equipped with a servocontrol (not represented), which controls the linear position of the rod 313 as a function of a setpoint position defined by the bonding machine 300.

The bonding machine 300 is equipped with processing means, such as a programmable microprocessor, which are capable of calculating the bonding curvature $K_B$ or a radius of curvature equivalent to the bonding curvature $K_B$, in the case of using a jack as in the machine 300 described here. More precisely, the initial curvatures $K_1$ and $K_2$, respectively, of the wafers 100 and 200, as well as the target post-bonding curvature $K_{Fc}$ are entered into the bonding machine, and the processing means of the bonding machine then calculates the bonding curvature $K_B$ to be imposed by using Formula (6) given above and invert this value in order to obtain the corresponding target radius of curvature $R_{cb}$ ($R_{cb}=1/K_B$).

The final parameter to be defined, which needs to be sent to the servocontrol of the jack 312, is the bow $\Delta Z$ corresponding to the radius of curvature $R_{cb}$, because, as indicated above, the bow of a wafer corresponds to the distance taken at the center of the wafer between a reference plane, here, the holding surface 311, and the surface of the wafer, here, the surface of the wafer facing the holding surface 311. The bow $\Delta Z$ corresponds to the distance dt over which the rod 313 must be extended when imposing the bonding curvature.

The target bow $\Delta zc$ as a function of the target radius of curvature $R_d$) may be calculated with the following Formula (7):

$$\Delta zc = R_{cb} - \sqrt{(R_{cb}^2 - (D/2)^2)} \qquad (7)$$

where D is the diameter of the wafer to be curved.

Once calculated, the numerical value of the target bow $\Delta zc$ is transmitted to the servocontrol of the jack 312, which actuates the rod in order to position it at the equivalent distance $d_t$ ($d_t = \Delta zc$).

When the bonding curvature $K_B$ is applied to the first wafer 100, the support plates 310 and 320 are moved toward one another so that the foremost portion 100a (apex) of the wafer 100 is delicately placed in contact with the exposed surface of the second wafer 200 so as to thus initiate the propagation of a bonding wave (FIG. 5D, Step S5). The means for holding the second wafer 200 on its support plate 320 have been deactivated before or while bringing the two wafers into contact, in order to allow the second wafer 200 to adapt to the deformation (curvature $K_c$ imposed on the first wafer 100 during the bonding.

As an alternative, the two wafers may be placed at a distance Δzc from one another and one of the two wafers may subsequently be deformed until the surfaces are brought in intimate contact by actuating the rod 313 over a distance $d_r=\Delta zc$. Imposition of the bonding curvature $K_B$ and initiation of the propagation of the bonding wave are thus performed simultaneously. In this case as well, the wafer that is not deformed to the predefined bonding curvature must be free to adapt to the bonding curvature imposed on the other wafer during the propagation of the bonding wave.

Molecular adhesion bonding is a technique well known in the art. As a reminder, the principle of molecular adhesion bonding is based on bringing two surfaces in direct contact, that is to say, without using a specific material (adhesive, wax, braze, etc.). Such an operation requires that the surfaces to be bonded are sufficiently smooth, and free of particles or contamination, and that they are brought sufficiently close together in order to make it possible to initiate contact, typically at a distance of less than a few nanometers. In this case, the attractive forces between the two surfaces are high enough to cause the propagation of a bonding wave that leads to molecular adhesion (bonding induced by all the attractive forces (Van Der Waals forces) of electronic interaction between atoms or molecules of the two surfaces to be bonded).

Once the propagation of the bonding wave has been initiated, the second wafer 200, then released from its support plate 320, adapts to the curvature imposed on the first wafer 100 during the progression of the bonding wave (FIG. 5E, Step S6). As used in the phrase "the second wafer adapts to the curvature imposed on the first wafer," the term "adapts" means that the second wafer assumes a curvature so that it comes into contact with, or assumes the form of, the first wafer throughout all, or substantially all, of its surface. "Adaptation by the second wafer to the curvature of the first wafer" is illustrated by transition of wafer 200 from FIG. 5D, where the second wafer has a substantially flat configuration, to FIG. 5E, where the second wafer curves so as to come into extensive contact with the first wafer.

Figure 5F:
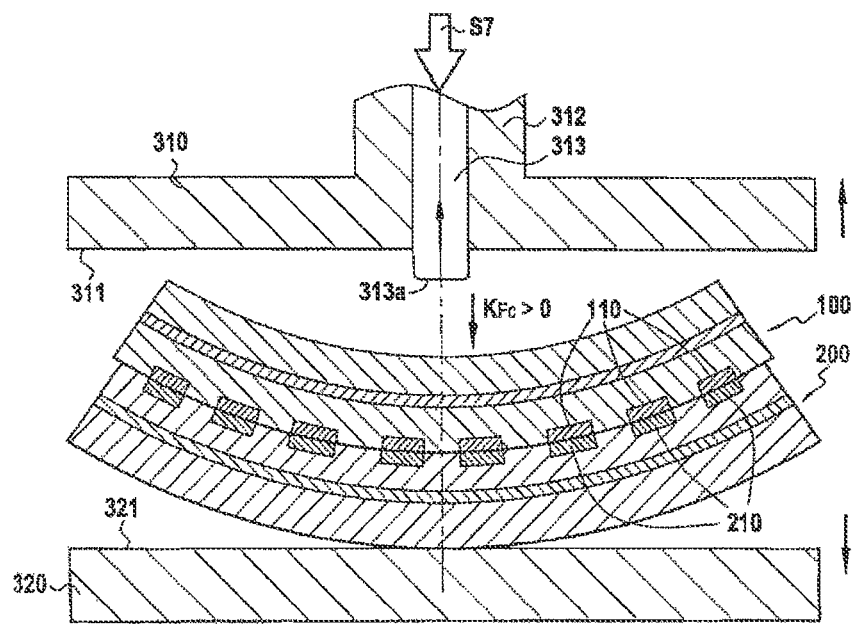

When the two wafers are completely bonded, the first wafer 100 is completely freed from its support (FIG. 5F, Step S7). A three-dimensional structure 400 is then obtained, which has the target curvature $K_{Fc}$ defined beforehand.

It has thus been possible to compensate for the radial misalignment existing between the two wafers 100 and 200 by applying a predetermined bonding curvature. After the bonding, the microcomponents 110 remain correctly aligned with the microcomponents 210, despite the radial misalignment initially existing before bonding.

Figure 7:
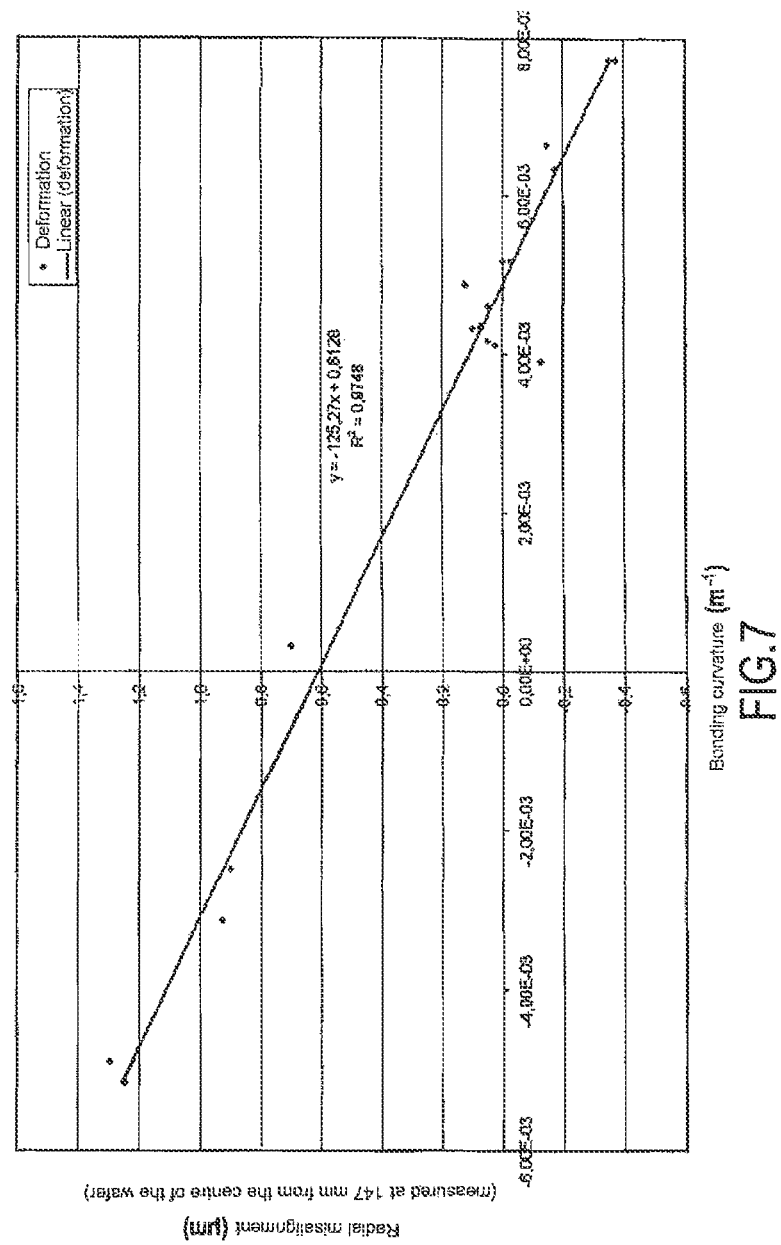
FIG. 7 is a graph showing the variation of a final radial misalignment as a function of the curvature imposed on two wafers during their bonding by molecular adhesion.

The curve in FIG. 7 corresponds to measurements carried out on two wafers with a diameter of 300 mm and a thickness of 775 μm, each having two levels of metals and a bonding layer that is composed of a deposited oxide of the TEOS type and has been prepared. FIG. 7 shows the variation of the radial misalignment as a function of the post-bonding curvature $K_F$ of the wafers. It can be seen that for a post-bonding curvature $K_F$ of approximately 0.005 m$^{-1}$, corresponding to a bow of approximately 55 μm, the initial radial misalignment has been entirely compensated. This curve shows clearly that, by adjusting the post-bonding curvature, it is possible to create an additional radial misalignment component that makes it possible to compensate for that of the initial radial misalignment existing between the wafers.

After the bonding, the structure 400 may be subjected to a moderate heat treatment (less than 500° C.) so as to increase the bonding energy between the two wafers and allow one of them to be subsequently thinned.

Figure 5G:
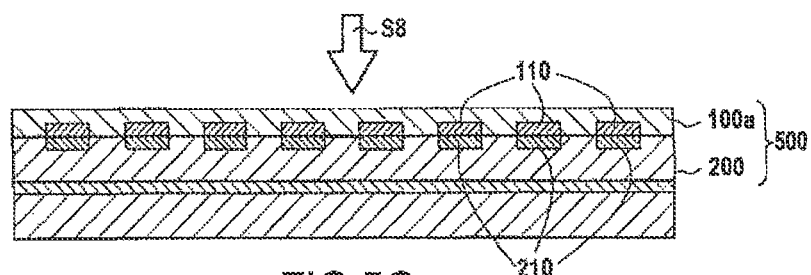
Figure 6:
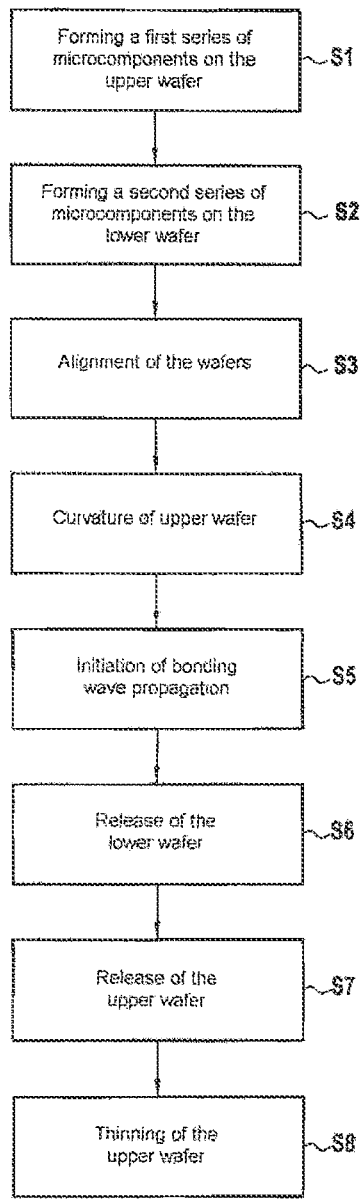
FIG. 6 is a flow chart of the steps employed during the production of the three-dimensional structure illustrated in FIGS. 5A to 5G.

As represented in FIG. 5G, the first wafer 100 is thinned in order to remove a portion of material present above the layer of microcomponents 110 (Step S8). The wafer 100 may be thinned, in particular, by chemical-mechanical polishing (CMP), by chemical etching, or by cleavage or fracture along a weakened plane formed beforehand in the substrate, for example, by atom implantation. In the event that the first wafer is a substrate of the SOI type, as is the case here, the buried insulating layer may be advantageously used as a chemical etching stop layer in order to delimit the thickness of the remaining layer 100a. As an alternative, if the initial substrate is made of bulk material, deep zones, for example, zones of metallic material regularly spaced on the surface of the material, may be formed in it beforehand during the formation of the components in order to stop the mechanical thinning (polishing).

A three-dimensional structure 500 is then obtained, formed by the second wafer 200 and a layer 100a corresponding to the remaining portion of the first wafer 100.

According to an alternative embodiment, after formation of the microcomponents, an oxide layer, for example, of $SiO_2$, may be deposited on the surface of the first and/or lower wafer with a view to preparation for the bonding. This oxide layer, or these oxide layers, may furthermore be prepared by forming metal zones in them, for example, of copper, in contact with all or some of the microcomponents in order to be able to bring the microcomponents of one wafer in contact with those of the other wafer.

The bonding faces of the wafers may furthermore be treated. The treatments employed for the surface preparation vary according to the bonding energy, which is intended to be obtained. If the intention is to obtain a standard bonding energy, that is to say, a relatively low one, the surface may be prepared by carrying out chemical-mechanical polishing followed by cleaning. Otherwise, if the intention is to obtain a high bonding energy between the two substrates, the preparation of the surface comprises cleaning of the RCA type (i.e., the combination of an SC1 bath ($NH_4OH$, $H_2O_2$, $H_2O$) adapted to remove the particles and the hydrocarbons and an SC2 bath (HCl, $H_2O_2$, $H_2O$) adapted to remove the metallic contaminants), surface activation by a plasma, and additional cleaning followed by brushing.

The bonding is preferably carried out at a controlled temperature in order to reduce the temperature difference between the two wafers.

The imposition of the bonding curvature may also be carried out with a bonding machine comprising a membrane interposed between the first wafer and the support for holding it, the membrane having a curvature corresponding to the predefined bonding curvature, or with a bonding machine comprising a holding support for the first wafer having a curvature corresponding to the predefined bonding curvature, in which case, the holding support may, in particular, be deformable and driven by the machine in order to adapt to the bonding curvature calculated by it beforehand. The contacting of the second wafer with the first wafer and the release of the second wafer before initiation of the propagation of a bonding wave will be carried out as described above.

By virtue of the bonding method of the invention with compensation for the radial misalignment, it has been possible to bond the first wafer 100 (top) onto the second wafer 200 (base) without significant offsets between the microcomponents 110 and 210. It is thus possible to limit the radial misalignments to negligible values homogeneously over the entire surface of the wafers. The microcomponents 110 and 210, even if they are of very small sizes (for example, <1 μm), can then be formed easily in alignment with one another. This makes it possible, for example, to interconnect the microcomponents with one another by means of metallic connections, while minimizing the risks of bad interconnection.

Figure 8:
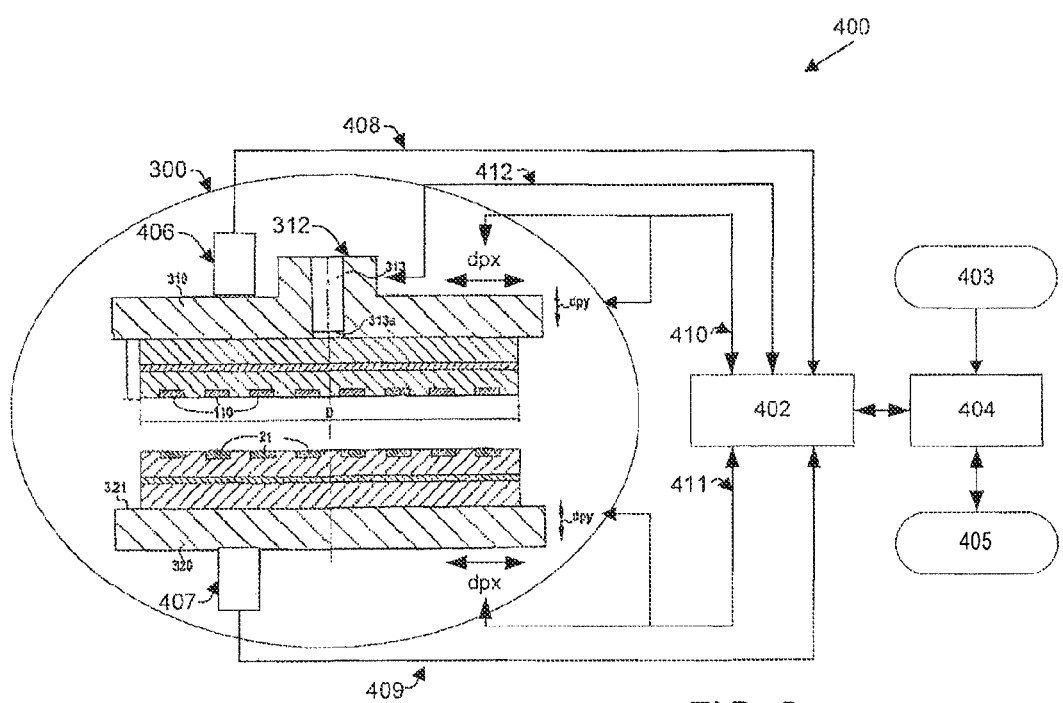
FIG. 8 is a schematic illustration of an apparatus of this invention.

FIG. 8 schematically illustrates apparatus 400 of the invention, which includes the previously described bonding machine 300 along with associated control means 402 and processing means 404. Processing means 404, which can be a standard microprocessor (or microprocessor system), receives sensor information 403 (e.g., information describing wafer misalignments, in particular, initial radial misalignments) and computes therefrom bonding curvature information, wafer displacement information and so forth, which information it sends on to control means 402. Control means, which can be a standard microcontroller and/or logic elements, receives information from the processing means and generates the control signals (e.g., sequences of voltages, currents and so forth) needed to control actuators present in bonding machine 300. Specifically, control signals 410 control linear actuators displacing upper holding plate 310 in the dpx and dpy directions, while control signals 411 perform the same function with respect to lower wafer holding plate 321. Control signals 408 control holding means 406, which hold/release wafers from the upper holding plate, while control signals 409 perform the same function with respect to holding means 407 for lower wafer holding plate. Finally, control signals 412 control actuators, e.g., linear actuator 312 displacing jack 313, that impose bonding curvatures, which have been determined by computer means 404 from input sensor information 403, on wafers being bonded. Overall operations of the apparatus can be controlled by programming executed by microprocessor 404 as directed by user input received via user interfaces 405. The programming is preferably constructed to perform the methods of this invention, either fully automatically or with partial user guidance.

The preferred embodiments of the invention described above do not limit the scope of the invention, since these embodiments are illustrations of several preferred aspects of the invention. Any equivalent embodiments are intended to be within the scope of this invention. Indeed, various modifications of the invention in addition to those shown and described herein, such as alternate useful combinations of the elements described, will become apparent to those skilled in the art from the subsequent description. Such modifications are also intended to fall within the scope of the appended claims. In the following (and in the application as a whole), headings and legends are used for clarity and convenience only.

The words "significant" and "likely" (and similar words of degree) are used herein to mean within acceptable and expected limits, usually commercially acceptable limits. It should be understood that this invention is not limited to commercial uses; intended uses include research uses, special purpose uses, and so forth.

What is claimed is:

1. A method for bonding a first wafer on a second wafer by molecular adhesion, the wafers comprising microcomponents on their respective bonding faces wherein at least some of the microcomponents of one of the wafers being intended to be aligned with at least some of the microcomponents of the other wafer, and with the microcomponents on each respective wafer having an initial radial misalignment between them, which method comprises:
    calculating a predefined bonding curvature as a function of the initial radial misalignment, calculating the predefined bonding curvature including:
        measuring the initial radial misalignment between the two wafers to be compensated; and
        determining a compensation radial misalignment in dependence at least in part on the initial radial misalignment between the two wafers; and
    bringing the two wafers into contact so as to initiate the propagation of a bonding wave between the two wafers, wherein the predefined bonding curvature is imposed on at least one of the two wafers during the contacting step in order to compensate for the initial radial misalignment.

2. The method according to claim 1, wherein the second wafer is free to adapt to the predefined bonding curvature imposed on the first wafer during the propagation of the bonding wave.

3. The method according to claim 1, wherein the wafers are circular wafers of silicon with a diameter of 300 mm, with each comprising microcomponents.

4. The method according to claim 1, wherein bringing the bonding faces of the two wafers into contact comprises:
    holding the first wafer using a first holding support, the first support imposing the predefined bonding curvature on the first wafer;
    holding the second wafer facing the first wafer using a second holding support;
    contacting the bonding faces of the wafers in order to initiate the propagation of a bonding wave between the wafers; and
    releasing the second wafer from the second holding support before or while being brought in contact with the first wafer, so that the second wafer adapts to the bonding curvature imposed on the first wafer during the propagation of the bonding wave.

5. The method according to claim 4, wherein the predefined bonding curvature is imposed on the first wafer by actuating a jack mounted on the first holding support.

6. The method according to claim 4, wherein the predefined bonding curvature is imposed on the first wafer by a membrane interposed between the first wafer and the first holding support, the membrane having a curvature corresponding to the predefined bonding curvature.

7. The method according to claim 4, wherein the predefined bonding curvature is imposed on the first wafer by the first holding support, the first holding support having a curvature corresponding to the predefined bonding curvature.

8. The method according to claim 4, which further comprises releasing the second wafer from the second support before or while being brought in contact with the first wafer, so that the second wafer adapts to the bonding curvature imposed on the first wafer during the propagation of a bonding wave.

9. The method according to claim 4, wherein the calculating the predefined bonding curvature or a radius of curvature corresponding to the predefined bonding curvature as a function of the initial radial misalignment is conducted by a standard microprocessor or microprocessor system.

10. The method according to claim 4, which further comprises interposing a jack capable of imposing the predefined bonding curvature on the first wafer, the jack being driven according to a radius of curvature corresponding to the predefined bonding curvature.

11. The method according to claim 4, which further comprises interposing a membrane between the first wafer and the first holding support, the membrane having a curvature corresponding to the predefined bonding curvature.

12. The method according to claim 8, which further comprises controlling the holding supports by a standard microcontroller or logic elements, receiving sensor information that defines radial wafer misalignments and computing therefrom bonding curvature information and wafer displacement information, which is used for the controlling of the holding supports.

13. The method according to claim 1, which further comprises:
   measuring the curvature of each wafer prior to bonding;
   calculating a post-bonding curvature capable of compensating for the initial radial misalignment between the two wafers; and
   calculating the predefined bonding curvature in dependence at least in part on the calculated post-bonding curvature and the measured curvatures of each wafer.

14. The method according to claim 13, wherein the post-bonding curvature is calculated using the following formula:

$$K_{Fc}=D_{Rc}/(h \cdot R)$$

where $K_{Fc}$ is the post-bonding curvature, $D_{Rc}$ is the compensation radial misalignment, h is the thickness of the first wafer and R is the distance from the center of the wafer to the measurement point of the radial misalignment.

15. The method according to claim 13, wherein the predefined bonding curvature is calculated using the following formula:

$$K_B=(8K_{Fc}-(K_1+K_2))/6$$

where $K_B$ is the predefined bonding curvature, $K_1$ is the initial curvature of the first wafer, $K_2$ is the initial curvature of the second wafer and $K_{Fc}$ is the post-bonding curvature.

16. A method for bonding a first wafer on a second wafer by molecular adhesion, the wafers comprising microcomponents on their respective bonding faces wherein at least some of the microcomponents of one of the wafers are intended to be aligned with at least some of the microcomponents of the other wafer, and with the microcomponents on each respective wafer having an initial radial misalignment between them, which method comprises:
   measuring the curvature of each wafer prior to bonding;
   calculating a post-bonding curvature capable of compensating for the initial radial misalignment between the two wafers;
   calculating a predefined bonding curvature as a function of the initial radial misalignment and calculating the predefined bonding curvature in dependence at least in part on the calculated post-bonding curvature and the measured curvatures of each wafer; and
   bringing the two wafers into contact so as to initiate the propagation of a bonding wave between the two wafers, wherein the predefined bonding curvature is imposed on at least one of the two wafers during the contacting step in order to compensate for the initial radial misalignment.

17. The method according to claim 16, wherein the post-bonding curvature is calculated using the following formula:

$$K_{Fc}=D_{Rc}/(h \cdot R)$$

where $K_{Fc}$ is the post-bonding curvature, $D_{Rc}$ is the compensation radial misalignment, h is the thickness of the first wafer and R is the distance from the center of the wafer to the measurement point of the radial misalignment.

18. The method according to claim 16, wherein the predefined bonding curvature is calculated using the following formula:

$$K_B=(8K_{Fc}-(K_1+K_2))/6$$

where $K_B$ is the predefined bonding curvature, $K_1$ is the initial curvature of the first wafer, $K_2$ is the initial curvature of the second wafer and $K_{Fc}$ is the post-bonding curvature.

* * * * *